(12) United States Patent
Hanafusa et al.

(10) Patent No.: US 9,082,530 B2
(45) Date of Patent: Jul. 14, 2015

(54) SUPERCONDUCTING THIN FILM MATERIAL AND METHOD OF MANUFACTURING SAME

(75) Inventors: Kei Hanafusa, Osaka (JP); Genki Honda, Osaka (JP); Kotaro Ohki, Osaka (JP); Tsuyoshi Nakanishi, Osaka (JP); Takahiro Taneda, Osaka (JP); Tatsuoki Nagaishi, Osaka (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days.

(21) Appl. No.: 14/112,086

(22) PCT Filed: May 9, 2012

(86) PCT No.: PCT/JP2012/061843
§ 371 (c)(1),
(2), (4) Date: Oct. 16, 2013

(87) PCT Pub. No.: WO2012/165109
PCT Pub. Date: Dec. 6, 2012

(65) Prior Publication Data
US 2014/0038829 A1    Feb. 6, 2014

(30) Foreign Application Priority Data

May 30, 2011 (JP) ................................. 2011-120500

(51) Int. Cl.
*H01L 39/24* (2006.01)
*H01B 12/02* (2006.01)
*H01L 39/14* (2006.01)

(52) U.S. Cl.
CPC .............. *H01B 12/02* (2013.01); *H01L 39/143* (2013.01); *H01L 39/2422* (2013.01); *H01L 39/2425* (2013.01); *H01L 39/2448* (2013.01)

(58) Field of Classification Search
CPC .............................. H01B 12/02; H01L 39/143
USPC .................................................. 505/234, 237
See application file for complete search history.

(56) References Cited

U.S. PATENT DOCUMENTS 5,449,659 A * 9/1995 Garrison et al. ............... 505/330
7,858,558 B2 * 12/2010 Hahakura et al. ............. 505/234
(Continued)

FOREIGN PATENT DOCUMENTS

CN    101111906 A    1/2008
CN    101385097 A    3/2009
(Continued)

OTHER PUBLICATIONS

Machine translation of JP 2007-311234 (2007).*

*Primary Examiner* — Paul Wartalowicz
(74) *Attorney, Agent, or Firm* — Drinker Biddle & Reath LLP (57) ABSTRACT

A superconducting thin film material exhibiting excellent superconducting properties and a method of manufacturing the same are provided. A superconducting thin film material includes a substrate, and a superconducting film formed on the substrate. The superconducting film includes an MOD layer formed by an MOD process, and a gas-phase-formed layer formed on the MOD layer by a gas-phase process. Since the MOD layer is formed first and then the gas-phase-formed layer is formed in this manner, degradation of the properties of the gas-phase-formed layer due to heat treatment in the step of forming the MOD layer (heat treatment in the MOD process) can be prevented.

13 Claims, 10 Drawing Sheets

(56) References Cited

U.S. PATENT DOCUMENTS

| | | | |
|---|---|---|---|
| 2009/0137400 A1* | 5/2009 | Hahakura et al. | 505/234 |
| 2009/0149330 A1 | 6/2009 | Hahakura et al. | |
| 2009/0239753 A1* | 9/2009 | Hahakura et al. | 505/234 |
| 2010/0160169 A1 | 6/2010 | Hahakura et al. | |

FOREIGN PATENT DOCUMENTS

| | | |
|---|---|---|
| CN | 101449341 A | 6/2009 |
| JP | 2002-075079 A | 3/2002 |
| JP | 2007-220467 A | 8/2007 |
| JP | 2007-311234 A | 11/2007 |

* cited by examiner

SUPERCONDUCTING THIN FILM MATERIAL AND METHOD OF MANUFACTURING SAME

TECHNICAL FIELD

The present invention relates to superconducting thin film materials and methods of manufacturing the same, and more particularly to a superconducting thin film material having a superconducting film formed on a substrate and a method of manufacturing the same.

BACKGROUND ART

In recent years, superconducting thin film materials have been developed, such as a superconducting tape wire having a superconducting film formed on a metal substrate. Methods of forming a superconducting thin film are broadly classified into gas-phase process and application process. The gas-phase process includes gas-phase process and chemical vapor deposition process, and the gas-phase process includes co-vapor deposition process, sputtering process and Pulsed Laser Deposition (PLD) process. The chemical vapor deposition process includes Metal Organic Chemical Vapor Deposition (MOCVD) process. The application process includes Metal Organic Decomposition (MOD) process. Unlike the gas-phase process, the MOD process provides a high material yield and does not require an expensive vacuum apparatus, and is therefore known as a low cost process. For example, there has been proposed a superconducting thin film material having a structure in which an intermediate layer is formed on a metal tape, an oxide superconducting layer is formed on the intermediate layer by the gas-phase process, and an upper oxide superconducting layer is further formed on the oxide superconducting layer by the MOD process (see Japanese Patent Laying-Open No. 2007-311234 (Patent Document 1)). It is noted that the MOD process is indicated as a metal organic deposition method in Patent Document 1.

According to Patent Document 1, the above-described structure in which a gas-phase-formed layer is formed as a superconducting film having a high orientation by the gas-phase process and an MOD layer is formed thereon as a superconducting film by the MOD process allows for the formation of a superconducting film having a high orientation and a high surface smoothness at low cost, thereby obtaining excellent properties such as a high critical current density (Jc) and a high critical current (Ic).

CITATION LIST

Patent Document

PTD 1: Japanese Patent Laying-Open No. 2007-311234

SUMMARY OF INVENTION

Technical Problem

In the superconducting thin film material having the above-described structure, however, the MOD layer is formed by the MOD process after the gas-phase-formed layer has been formed. Since a heat treatment temperature during the process of decomposing organic metal in the MOD process is higher than a process temperature in a physical vapor deposition step during the formation of the gas-phase-formed layer, different phases may be generated in the gas-phase-formed layer due to the heat treatment in the MOD process, resulting in degradation of the properties (e.g., crystallinity) of the gas-phase-formed layer. Such degradation of the properties of the gas-phase-formed layer in turn leads to degradation of the superconducting properties (e.g., Ic) of the superconducting thin film material.

The present invention was made to solve the problems as described above, and an object of the present invention is to provide a superconducting thin film material exhibiting excellent superconducting properties and a method of manufacturing the same.

Solution to Problem

A superconducting thin film material according to the present invention includes a substrate, and a superconducting film formed on the substrate. The superconducting film includes an MOD layer formed by an MOD process, and a gas-phase-formed layer formed on the MOD layer by a gas-phase process.

Since the MOD layer is formed first and then the gas-phase-formed layer is formed in this manner, degradation of the properties of the gas-phase-formed layer due to heat treatment in the step of forming the MOD layer (crystallization heat treatment in the MOD process) can be prevented. Thus, degradation of the superconducting properties of the superconducting thin film material resulting from degradation of the properties of the gas-phase-formed layer can be prevented, thereby realizing a superconducting thin film material having excellent properties.

To provide a superconducting thin film material with excellent properties such as a high Jc and a high Ic, it is important to form a superconducting film having a sufficient film thickness while ensuring a high surface smoothness and a high orientation of the superconducting film. However, a gas-phase-formed film decreases in crystallinity with an increase in its thickness, and thus there is a limit to the thickness of the film that can be formed. For this reason, by forming a stacked film of an MOD layer and a gas-phase-formed layer as a superconducting film, the thickness of this superconducting film can be increased as compared to an example where the superconducting film is only formed of, for example, the gas-phase-formed layer. Consequently, Ic of the superconducting film can be reliably increased.

An MOD layer is formed by a thermal equilibrium process and therefore has very good crystallinity as well as good surface smoothness. By forming an MOD layer as a base for forming a gas-phase-formed layer, therefore, the crystallinity (e.g., orientation and surface smoothness) of the gas-phase-formed layer can be improved. Consequently, the superconducting properties of the entire superconducting thin film material can be improved.

The "orientation" as used herein refers to a degree to which the crystal orientations of crystal grains are aligned with one another. The "surface smoothness" refers to the flatness of the surface of a film.

Preferably, the above-described superconducting thin film material further includes an intermediate layer between the substrate and the superconducting film. By interposing the intermediate layer between the substrate and the superconducting film, the orientation of the superconducting film can be improved. In addition, the diffusion and reaction of atoms between the substrate and the superconducting film can be suppressed. Consequently, the properties of the superconducting thin film material can be improved and the range of choices for the substrate can be expanded.

Preferably, in the above-described superconducting thin film material, the superconducting film is formed on two opposite main surfaces of the substrate. As the superconducting film increases in film thickness, it becomes more difficult to ensure the surface smoothness, maintain the crystallinity and keep the process cost low, thus requiring strict control of film formation conditions. To address this issue, by forming the superconducting film on the two main surfaces of the substrate, the film thickness of the superconducting film on each main surface required to ensure a desired Ic of the entire superconducting thin film material can be reduced. It thus becomes easier to ensure the surface smoothness and maintain the crystallinity of the superconducting film on each main surface and to keep the process cost low, and a sufficient Ic can be ensured by the superconducting films on the two main surfaces. Furthermore, by providing the same structure on the two main surfaces, warpage in a wire width direction due to the stress of the film can be suppressed.

Preferably, in the above-described superconducting thin film material, a plurality of structures each formed of a combination of the MOD layer and the gas-phase-formed layer are stacked in the superconducting film. As described above, as a gas-phase-formed layer formed by a gas-phase process increases in film thickness, it becomes more difficult to ensure the surface smoothness. In addition, as an MOD layer formed by an MOD process increases in film thickness, Jc decreases, resulting in failure to obtain Ic commensurate with the process cost even if the thickness of the MOD layer is increased. To address this issue, by stacking the plurality of combinations each having the MOD layer and the gas-phase-formed layer as described above, the thickness per layer can be reduced for the MOD layers and the gas-phase-formed layers. Consequently, the surface smoothness can be improved and the crystallinity can be maintained in the superconducting film, and the process cost can be kept low. In other words, the thickness of the MOD layer is limited to a degree where a high Jc is maintained, the MOD layer is formed again on the superconducting film, and the gas-phase-formed layer is further formed on this MOD layer, thereby increasing the film thickness of and improving the surface smoothness of the superconducting film. By stacking the plurality of structures each formed of a combination of the gas-phase-formed layer and the MOD layer in this manner, a superconducting thin film material can be provided in which the surface smoothness is ensured, the crystallinity is maintained, the superconducting film having a sufficient film thickness is formed, and the superconducting properties such as desired Ic and Jc can be ensured.

Preferably, in the above-described superconducting thin film material, the MOD layer has a thickness of not more than 1 μm. As an MOD layer formed by an MOD process increases in film thickness, Jc decreases and the process cost increases. If the MOD layer has a thickness of not more than 1 μm, the process cost can be kept low. Preferably, in the above-described superconducting thin film material, the gas-phase-formed layer has a thickness of not more than 2 μm. As a gas-phase-formed layer formed by a gas-phase process increases in film thickness, it becomes more difficult to ensure the surface smoothness. If the gas-phase-formed layer has a thickness of not more than 2 μm, good surface smoothness can be ensured and the crystallinity can be maintained with relative ease.

Preferably, in the above-described superconducting thin film material, the above-described gas-phase process is a thin film forming method selected from the group consisting of co-vapor deposition process, PLD process, sputtering process and MOCVD process.

Preferably, in the above-described superconducting thin film material, the MOD process is a non-fluorine-containing MOD process in which a fluorine-containing organometallic salt solution is not used. The non-fluorine-containing MOD process is a typical deposition method of the MOD process with regard to a superconducting thin film. Unlike the Trifluoroacetate-Metal Organic Decomposition (TFA-MOD) process in which a fluorine-containing organometallic salt solution is used, the non-fluorine-containing MOD process is not a deposition process in which crystals of the superconducting film grow while fluorine separates from within the superconducting film in a film formation process, and there is also no need for the fluorine separation to be promoted uniformly. As such, a wide superconducting thin film material can be readily manufactured, for example, thus contributing to improved production efficiency. Moreover, hydrogen fluorine which requires careful handling is not generated during the film formation process, thus eliminating the cost of processing hydrogen fluorine. Furthermore, since the non-fluorine-containing MOD process can be performed using a near-neutral solution, the MOD layer can be formed without damaging the previously formed substrate and intermediate layer when the process is applied to the superconducting thin film material of the present invention. As a result, the properties of the superconducting thin film material of the present invention can be further improved while the manufacturing costs are kept low.

Solutions for use in the non-fluorine-containing MOD process include a metal acetylacetonate-containing solution (Y:Ba:Cu=1:2:3), a naphthenic acid-containing solution and the like, for example.

A method of manufacturing a superconducting thin film material according to the present invention includes a substrate preparation step of preparing a substrate, and a step of forming a superconducting film on the substrate. The step of forming a superconducting film includes the steps of forming an MOD layer by an MOD process, and forming a gas-phase-formed layer on the MOD layer by a gas-phase process.

According to the method of manufacturing a superconducting thin film material of the present invention, a superconducting thin film material which has excellent properties such as a high Jc and a high Ic and which can be realized at low cost can be manufactured, by utilizing the respective advantages of the gas-phase process and the MOD process while compensating their disadvantages for each other as described above.

Preferably, the method of manufacturing a superconducting thin film material of the present invention further includes, after the substrate preparation step and before the step of forming a superconducting film, the step of forming an intermediate layer between the substrate and the superconducting film.

By interposing the intermediate layer between the substrate and the superconducting film in this manner, the orientation of the superconducting film can be improved. In addition, the diffusion and reaction of atoms between the substrate and the superconducting film can be suppressed.

Preferably, in the method of manufacturing a superconducting thin film material of the present invention, in the step of forming an MOD layer, the MOD layer is formed on two opposite main surfaces of the substrate, and in the step of forming a gas-phase-formed layer, the gas-phase-formed layer is formed on the MOD layers on the two main surfaces of the substrate.

Consequently, the film thickness of the superconducting film on each main surface is reduced, allowing for ensuring the surface smoothness and maintaining a high Jc with ease, and ensuring a sufficient Ic by the superconducting films on the two main surfaces.

Preferably, in the method of manufacturing a superconducting thin film material of the present invention, the steps of forming an MOD layer and forming a gas-phase-formed layer are alternately performed more than once.

Consequently, the plurality of structures each formed of a combination of the MOD layer and the gas-phase-formed layer are stacked. Thus, a superconducting film having a sufficient film thickness can be formed in which the surface smoothness is ensured, the crystallinity is maintained and the process cost is kept low with ease while degradation of the properties of the gas-phase-formed layers is suppressed. As a result, a superconducting thin film material having superconducting properties such as desired Ic and Jc can be readily manufactured.

Preferably, in the method of manufacturing a superconducting thin film material of the present invention, in the step of forming an MOD layer, the MOD layer having a thickness of not more than 1 μm is formed. Consequently, the process cost of the MOD layer can be kept low with relative ease.

Preferably, in the method of manufacturing a superconducting thin film material of the present invention, in the step of forming a gas-phase-formed layer, the gas-phase-formed layer having a thickness of not more than 2 μm is formed. Consequently, good surface smoothness of the gas-phase-formed layer can be ensured with relative ease.

Preferably, in the method of manufacturing a superconducting thin film material of the present invention, the above-described gas-phase process is a vapor deposition process selected from the group consisting of co-vapor deposition process, PLD process, sputtering process and MOCVD process.

Preferably, in the method of manufacturing a superconducting thin film material of the present invention, the above-described MOD process is a non-fluorine-containing MOD process in which a fluorine-containing organometallic salt solution is not used.

Thus, unlike the TFA-MOD process which is a typical method of the MOD process, the non-fluorine-containing MOD process is not required to promote the fluorine separation uniformly, thus contributing to improved production efficiency. Moreover, hydrogen fluorine which requires careful handling is not generated during the film formation process, thus eliminating the cost of processing hydrogen fluorine. Furthermore, since this process can be performed using a near-neutral solution, the MOD layer can be formed without damaging the substrate and intermediate layer when the process is applied to the superconducting thin film material of the present invention. As a result, the properties of the superconducting thin film material of the present invention can be further improved while the manufacturing costs are kept low.

Advantageous Effects of Invention

According to the present invention, a superconducting thin film material having excellent superconducting properties can be realized.

DESCRIPTION OF EMBODIMENTS

The embodiments of the present invention will be hereinafter described with reference to the drawings, in which the same or corresponding parts are designated by the same reference numbers and description thereof will not be repeated.

First Embodiment

The structure of a superconducting thin film material of a first embodiment will be described with reference to FIG. 1.

Figure 1:
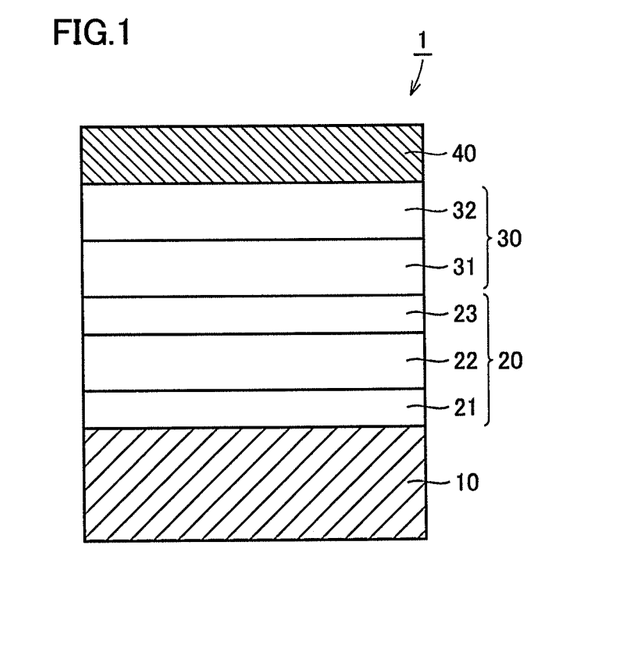
FIG. 1 is a schematic cross-sectional view showing the structure of a superconducting thin film material of a first embodiment.

Referring to FIG. 1, a superconducting thin film material 1 of the first embodiment includes an orientated metal substrate 10 as a substrate, an intermediate layer 20 formed on orientated metal substrate 10, an oxide superconducting film 30 as a superconducting film formed on intermediate layer 20, and a Ag (silver) stabilizing layer 40 as a stabilizing layer formed on oxide superconducting film 30 for the purpose of protecting oxide superconducting film 30. As a material for oxide superconducting film 30, a rare-earth-containing oxide superconducting material such as YBCO (an yttrium-containing high-temperature superconducting material: $YBa_2Cu_3O_x$), HoBCO (a holmium-containing high-temperature superconducting material: $HoBa_2Cu_3O_x$), or GdBCO (a gadolinium-containing high-temperature superconducting material: $GdBa_2Cu_3O_x$) can be selected. Oxide superconducting film 30 includes an MOD layer formed by an MOD process, and a gas-phase-formed layer formed on the MOD layer by a gas-phase process. Specifically, oxide superconducting film 30 includes, for example, an MOD-YBCO layer 31 as an MOD layer formed by an MOD process, and a gas-phase-formed GdBCO layer 32 as a gas-phase-formed layer formed on MOD-YBCO layer 31 by a gas-phase process. It is noted that the MOD layer and the gas-phase-formed layer of oxide superconducting film 30 may be made of the same material or different materials. For example, an MOD-GdBCO layer may be formed instead of MOD-YBCO layer 31. A gas-phase-formed YBCO layer may be formed instead of gas-phase-formed GdBCO layer 32.

As orientated metal substrate 10, for example, an orientated Ni (nickel) substrate, an orientated Ni alloy-containing substrate or the like can be selected. Specifically, for example, a clad substrate having a stacked structure of Ni/Cu/SUS, a clad substrate having a stacked structure of NiW/SUS, or a NiW substrate can be used.

Intermediate layer 20 can include at least one of $Y_2O_3$ (yttria), YSZ (yttria-stabilized zirconia) and $CeO_2$ (ceria), for example. Specifically, intermediate layer 20 can include a $Y_2O_3$ layer 21, a YSZ layer 22 formed on $Y_2O_3$ layer 21, and a $CeO_2$ layer 23 formed on YSZ layer 22. A $CeO_2$ layer may be formed instead of $Y_2O_3$ layer 21. Moreover, instead of the three-layer structure as described above, intermediate layer 20 may have a two-layer structure including $Y_2O_3$ layer 21 and a $CeO_2$ layer formed on $Y_2O_3$ layer 21, or a stacked structure including four or more layers. The stabilizing layer is not limited to Ag stabilizing layer 40 as described above. For example, a Cu (copper) stabilizing layer made of Cu may be used instead of Ag stabilizing layer 40.

A method of manufacturing the superconducting thin film material of the first embodiment will now be described with reference to FIGS. 1 to 7.

Figure 2:
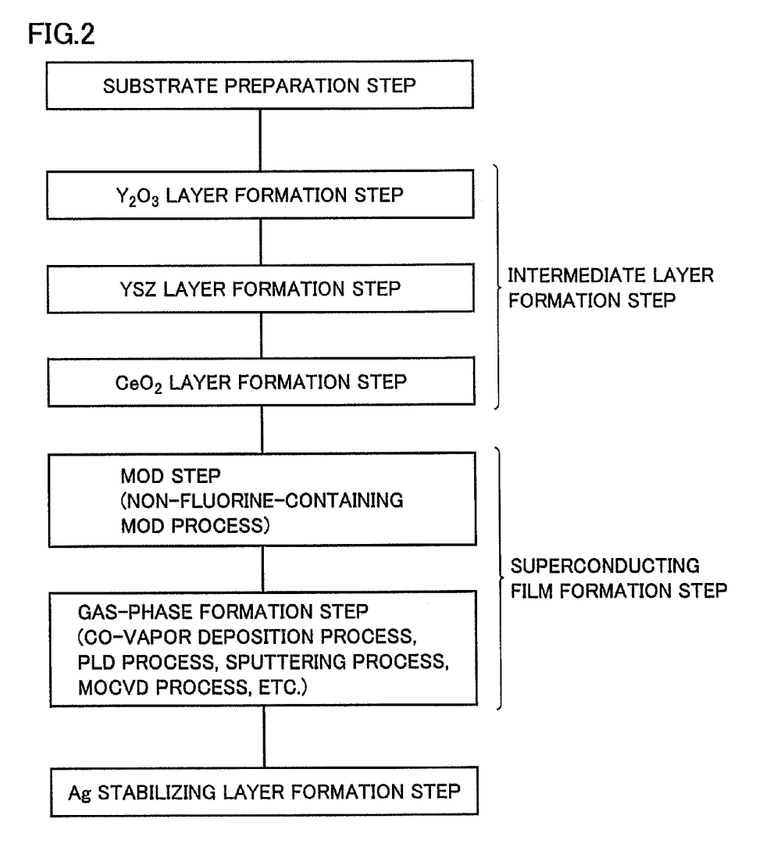
FIG. 2 illustrates the outline of manufacturing steps in a method of manufacturing the superconducting thin film material of the first embodiment.

Referring to FIG. 2, a substrate preparation step is performed first. Specifically, orientated metal substrate 10 such as a substrate in the form of a tape made of an orientated nickel alloy is prepared. Next, as shown in FIG. 2, an intermediate layer formation step of forming intermediate layer 20 on orientated metal substrate 10 is performed. Specifically, referring to FIGS. 2 and 5, a $Y_2O_3$ layer formation step, a YSZ layer formation step and a $CeO_2$ layer formation step are successively performed to successively form $Y_2O_3$ layer 21, YSZ layer 22 and $CeO_2$ layer 23 on orientated metal substrate 10. These $Y_2O_3$ layer formation step, YSZ layer formation step and $CeO_2$ layer formation step may be performed by a gas-phase process such as sputtering process, but may be performed by an MOD process.

Figure 3:
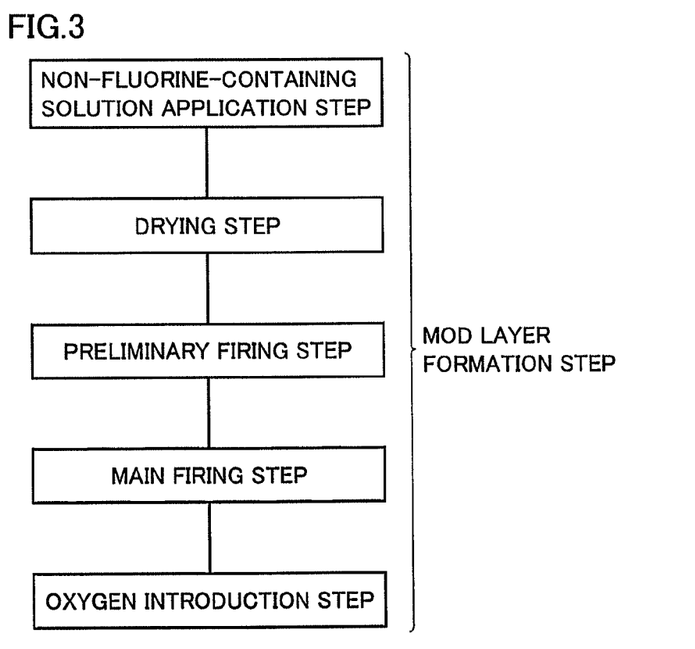
FIG. 3 illustrates the details of an MOD layer formation step in the manufacturing steps of FIG. 2.
Figure 6:
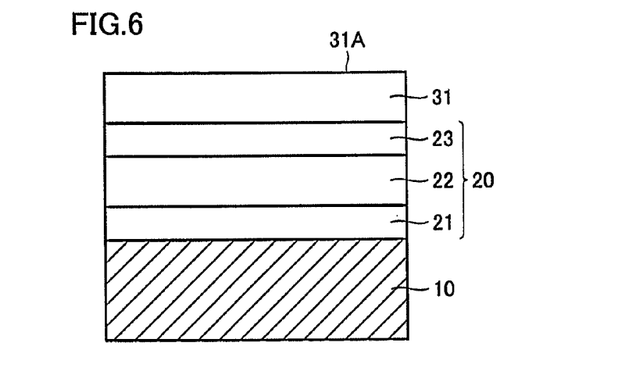
FIG. 6 is a schematic cross-sectional view illustrating the method of manufacturing the superconducting thin film material of the first embodiment.

Next, as shown in FIG. 2, a superconducting film formation step of forming oxide superconducting film 30 on intermediate layer 20 is performed. Specifically, as shown in FIGS. 2 and 6, an MOD step of forming MOD-YBCO layer 31 on intermediate layer 20 by an MOD process is performed. In this MOD step, first, as shown in FIG. 3, a non-fluorine-containing solution application step of applying an organometallic salt solution of non-fluorine-containing Y (yttrium), Ba (barium) and Cu (copper) such as a metal acetylacetonate-containing solution (Y:Ba:Cu=1:2:3) or a naphthenic acid-containing solution to a surface to intermediate layer 20 is performed. A dipping method, a die coating method or the like can be selected as a method of applying the organometallic salt solution in this non-fluorine-containing solution application step.

Next, as shown in FIG. 3, a drying step of drying the applied solution is performed. Specifically, a heating process (drying process) for removing water and alcohol from the applied solution is performed by setting a drying temperature to not less than 100° C. and not more than 150° C. In this drying step, a process of placing the material to which the solution has been applied into a drying furnace and heating the material is performed. It is noted that the non-fluorine-containing solution application step and the drying step may be successively performed. For example, a processing apparatus may be configured in such a manner that the orientated metal substrate in the form of a tape is delivered into a processing unit where the solution is applied, and the orientated metal substrate passes through the drying furnace directly thereafter.

Next, as shown in FIG. 3, a preliminary firing step of removing a solvent component or the like from the applied organometallic salt solution is performed. Specifically, orientated metal substrate 10 to which the organometallic salt solution has been applied is heated in the air in a temperature range from not less than 400° C. to not more than 600° C., for example, 500° C., to thermally decompose the applied organometallic salt solution. At this time, $CO_2$ (carbon dioxide) and $H_2O$ (water) separate, thus removing the solvent component or the like from the applied organometallic salt solution. As shown in FIG. 3, after the preliminary firing step is performed, a main firing step is performed. Specifically, orientated metal substrate 10 to which the organometallic salt solution has been applied is heated in a mixed atmosphere of Ar (argon) and $O_2$ (oxygen) in a temperature range from not less than 600° C. to not more than 850° C., for example, 780° C., to form MOD-YBCO layer 31 as an MOD layer.

Next, as shown in FIG. 3, an oxygen introduction step of performing heat treatment for introducing oxygen into MOD-YBCO layer 31 thus formed is performed. Specifically, slow cooling is performed over three hours from a maximum heating temperature of 550° C. to 200° C. at 1 atmospheric pressure in an atmospheric gas of 100% $O_2$ (oxygen), for example.

Figure 7:
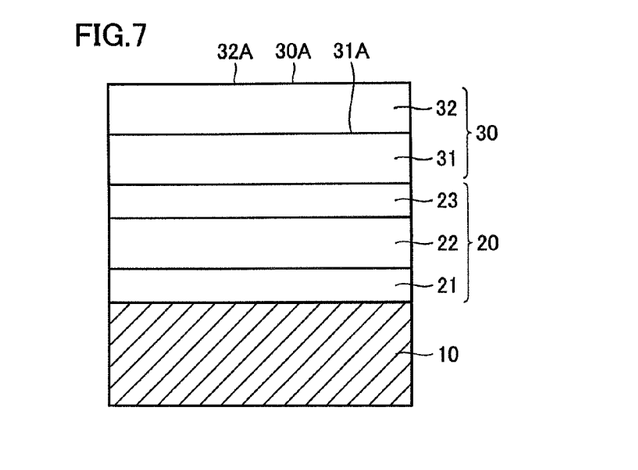
FIG. 7 is a schematic cross-sectional view illustrating the method of manufacturing the superconducting thin film material of the first embodiment.

Then, as shown in FIGS. 2 and 7, a gas-phase formation step of forming gas-phase-formed GdBCO layer 32 on MOD-YBCO layer 31 by a gas-phase process is performed. In this gas-phase formation step, it is preferable to use a thin film formation process selected from the group consisting of co-vapor deposition process, PLD process, sputtering process and MOCVD process. Particularly, if the PLD process is employed, gas-phase-formed GdBCO layer 32 forming oxide superconducting film 30 can have a composition close to a target composition and a high orientation can be ensured, thus contributing to the improvement of Jc and Ic of superconducting thin film material 1.

Figure 4:
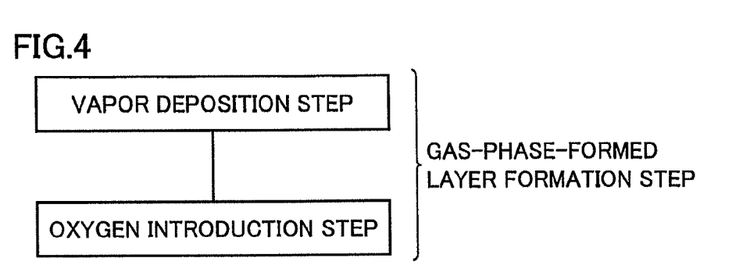
FIG. 4 illustrates the details of a gas-phase formation step in the manufacturing steps of FIG. 2.
Figure 5:
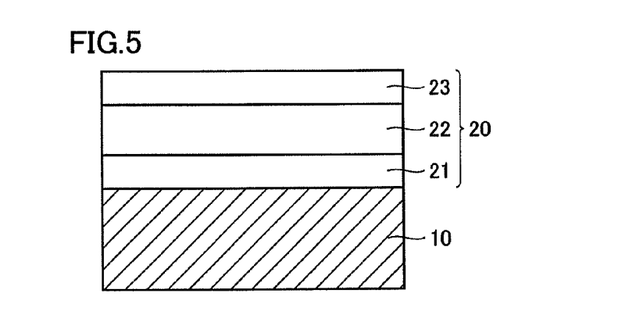
FIG. 5 is a schematic cross-sectional view illustrating the method of manufacturing the superconducting thin film material of the first embodiment.

In the gas-phase formation step shown in FIG. 2, specifically, a vapor deposition step is performed first as shown in FIG. 4. In this vapor deposition step, gas-phase-formed GdBCO layer 32 is formed on MOD-YBCO layer 31 using the above-described PLD process or the like. Then, an oxygen introduction step is performed as shown in FIG. 4. Specifically, in order to introduce oxygen into gas-phase-formed GdBCO layer 32 thus formed, slow cooling is performed over three hours from a maximum heating temperature of 550° C. to 200° C. at 1 atmospheric pressure in an atmospheric gas of 100% $O_2$ (oxygen), for example.

Referring now to FIGS. 6 and 7, when MOD-YBCO layer 31 formed by the MOD process as described above is provided with a certain amount of film thickness, an MOD-YBCO layer surface 31A which is a surface of MOD-YBCO layer 31 maintains a sufficiently good surface smoothness. Thus, by forming gas-phase-formed GdBCO layer 32 on smooth MOD-YBCO layer surface 31A, a gas-phase-formed GdBCO layer surface 32A which is a surface of gas-phase-formed GdBCO layer 32 also has a good surface smoothness. The surface with such good surface smoothness serves as a superconducting film surface 30A which is a surface of oxide superconducting film 30. Consequently, oxide superconducting film 30 having excellent surface smoothness is formed, thus improving Ic, Jc and the like of superconducting thin film material 1.

Then, as shown in FIG. 2, a Ag stabilizing layer formation step of forming Ag stabilizing layer 40 as a stabilizing layer is performed. Ag stabilizing layer 40 can be formed by a sputtering process, for example. By performing the steps described above, superconducting thin film material 1 of the first embodiment is manufactured.

According to superconducting thin film material 1 and the method of manufacturing the same of the first embodiment, since MOD-YBCO layer 31 is formed first and then gas-phase-formed GdBCO layer 32 is formed, this gas-phase-formed GdBCO layer 32 is not subjected to the heat treatment such as the main firing step in the MOD layer formation step. Thus, the occurrence of a problem of degradation of the quality such as crystallinity of gas-phase-formed GdBCO layer 32 due to the heat treatment can be suppressed. As a result, degradation of the superconducting properties of oxide superconducting film 30 can be suppressed.

According to superconducting thin film material 1 and the method of manufacturing the same of the first embodiment, superconducting thin film material 1 having excellent properties such as a high Jc and a high Ic can be provided by utilizing the respective advantages of the PLD process and the non-fluorine-containing MOD process while compensating their disadvantages for each other.

Preferably, in the first embodiment, MOD-YBCO layer 31 has a thickness of not more than 1 µm. As MOD-YBCO layer 31 formed by the MOD process increases in film thickness, Jc decreases. If MOD-YBCO layer 31 has a thickness of not more than 1 µM, a high Jc can be maintained, thus suppressing the increased cost.

Preferably, in the first embodiment, gas-phase-formed GdBCO layer 32 has a thickness of not more than 2 µm, and more preferably not more than 1.5 µm. As gas-phase-formed GdBCO layer 32 formed by the PLD process increases in film thickness, it becomes more difficult to ensure the surface smoothness and maintain the crystallinity. If gas-phase-formed GdBCO layer 32 has a thickness of not more than 2 µm, good surface smoothness can be ensured with relative ease.

Second Embodiment

The structure of a superconducting thin film material of a second embodiment will be described with reference to FIG. 8.

Figure 8:
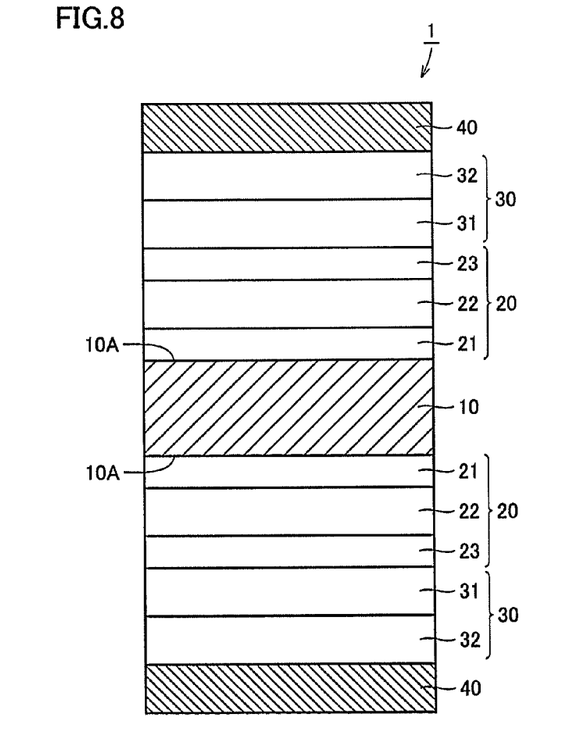
FIG. 8 is a schematic cross-sectional view showing the structure of a superconducting thin film material of a second embodiment.

Referring to FIG. 8, superconducting thin film material 1 of the second embodiment has a structure basically similar to that of superconducting thin film material 1 of the first embodiment described above. However, superconducting thin film material 1 of the second embodiment is different from superconducting thin film material 1 of the first embodiment in that intermediate layer 20, oxide superconducting film 30 and Ag stabilizing layer 40 are formed on two opposite main surfaces of orientated metal substrate 10. As oxide superconducting film 30 increases in film thickness, it becomes more difficult to ensure the surface smoothness, maintain the crystallinity and suppress the increased cost due to the decrease in Jc, thus requiring strict control of film formation conditions. To address this issue, by forming oxide superconducting film 30 on two main surfaces 10A of orientated metal substrate 10 in the second embodiment, the film thickness of oxide superconducting film 30 on each main surface 10A required to ensure a desired high Ic can be made equal to or smaller than the thickness in the first embodiment. It thus becomes easier to ensure the surface smoothness and maintain the crystallinity of oxide superconducting film 30 on each main surface 10A and to suppress the increased cost due to the decrease in Jc, and a high Ic can be obtained by oxide superconducting films 30 on two main surfaces 10A.

Figure 9:
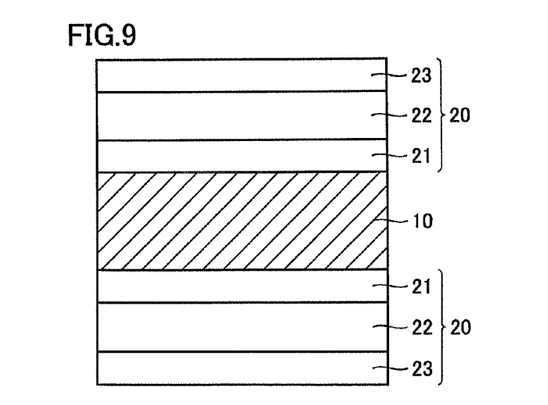
FIG. 9 is a schematic cross-sectional view illustrating a method of manufacturing the superconducting thin film material of the second embodiment.
Figure 10:
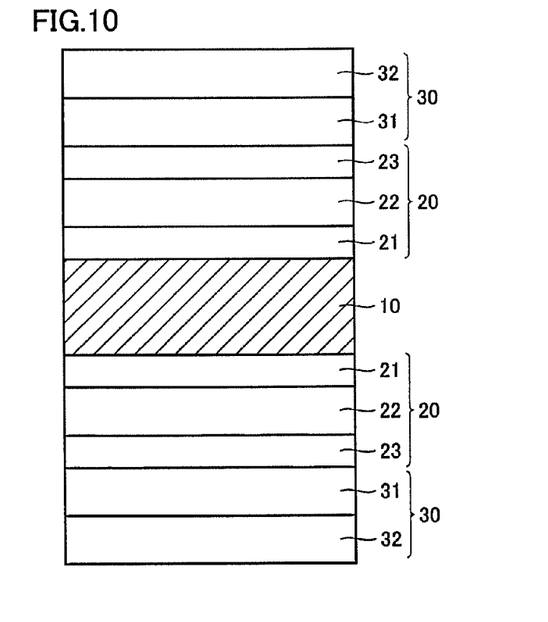
FIG. 10 is a schematic cross-sectional view illustrating the method of manufacturing the superconducting thin film material of the second embodiment.

A method of manufacturing the superconducting thin film material of the second embodiment will now be described with reference to FIGS. 8 to 10.

The method of manufacturing the superconducting thin film material of the second embodiment is basically similar to the method of manufacturing the superconducting thin film material of the first embodiment described with reference to FIGS. 1 to 7. Referring to FIG. 2, however, the second embodiment is different from the first embodiment in that intermediate layer 20, oxide superconducting film 30 and Ag stabilizing layer 40 are formed on two opposite main surfaces 10A of orientated metal substrate 10 in the intermediate layer formation step, the superconducting film formation step and the Ag stabilizing layer formation step, respectively. Specifically, in the intermediate layer formation step, intermediate layer 20 including $Y_2O_3$ layer 21, YSZ layer 22 and $CeO_2$ layer 23 is formed on each of two main surfaces 10A of orientated metal substrate 10, as shown in FIG. 9. Then, in the superconducting film formation step, oxide superconducting film 30 is formed on each of both intermediate layers 20, as shown in FIG. 10. Then, in the Ag stabilizing layer formation step, Ag stabilizing layer 40 is formed on each of both oxide superconducting films 30, to complete superconducting thin film material 1 of the second embodiment shown in FIG. 8.

It is noted that, in the intermediate layer formation step, the superconducting film formation step and the Ag stabilizing layer formation step, intermediate layers 20, oxide superconducting films 30 and Ag stabilizing layers 40 on two main surfaces 10A of orientated metal substrate 10 may be formed separately on each side, or may be formed simultaneously on both sides. If MOD-YBCO layer 31 is formed simultaneously on both intermediate layers 20 by a non-fluorine-containing MOD process, they can be formed by immersing orientated metal substrate 10 having intermediate layers 20 formed thereon in an organometallic salt solution by a dipping method, for example. If gas-phase-formed GdBCO layers 32 are formed simultaneously on two main surfaces 10A by a gas-phase process, these gas-phase-formed GdBCO layers 32 can be formed from opposite sides of orientated metal substrate 10 by a PLD process, for example.

Third Embodiment

The structure of a superconducting thin film material of a third embodiment will be described with reference to FIG. 11.

Figure 11:
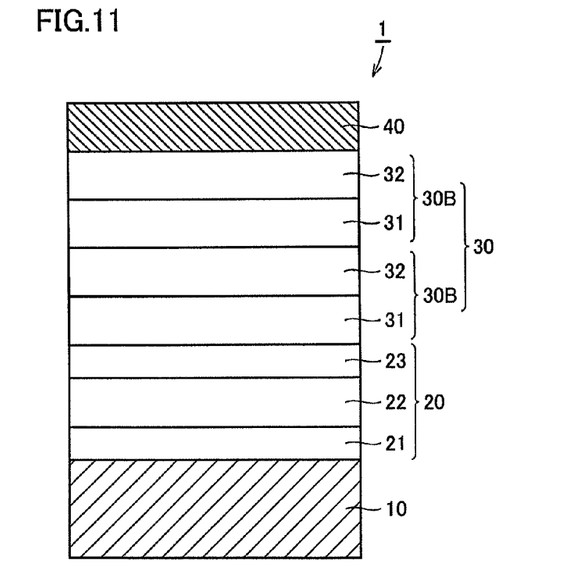
FIG. 11 is a schematic cross-sectional view showing the structure of a superconducting thin film material of a third embodiment.

Referring to FIG. 11, superconducting thin film material 1 of the third embodiment has a structure basically similar to that of superconducting thin film material 1 of the first embodiment described above. However, superconducting thin film material 1 of the third embodiment is different from superconducting thin film material 1 of the first embodiment in that a plurality of structures each formed of a combination of MOD-YBCO layer 31 and gas-phase-formed GdBCO layer 32 are stacked in oxide superconducting film 30. Specifically, a plurality of stacked structures 30B each having gas-phase-formed GdBCO layer 32 formed on MOD-YBCO layer 31 are stacked to form oxide superconducting film 30. Although FIG. 11 shows two stacked structures 30B, three or more stacked structures 30B may be stacked to obtain a desired film thickness of oxide superconducting film 30.

As described above, as MOD-YBCO layer 31 formed by the MOD process increases in film thickness, Jc decreases, making it more difficult to suppress the increased cost. Moreover, as gas-phase-formed GdBCO layer 32 formed by the gas-phase process increases in film thickness, it becomes more difficult to ensure the surface smoothness and maintain the crystallinity. Furthermore, if gas-phase-formed GdBCO layer 32 is formed first and then MOD-YBCO layer 31 is formed, the quality of gas-phase-formed GdBCO layer 32 may be degraded due to the heat treatment of the main firing step in the steps of forming this MOD-YBCO layer 31. To address this issue, by forming MOD-YBCO layer 31 first and then forming gas-phase-formed GdBCO layer 32 on MOD-YBCO layer 31 having excellent crystallinity, the crystallinity of gas-phase-formed GdBCO layer 32 can also be improved, thus suppressing the degradation of the quality of the gas-phase-formed layer in the structure of Patent Document 1. Consequently, the quality of gas-phase-formed GdBCO layer 32 can be maintained to improve the properties of oxide superconducting film 30.

Furthermore, since the film thickness of gas-phase-formed GdBCO layer 32 formed on the surface of MOD-YBCO layer 31 having excellent surface smoothness is limited to a degree where a decrease in crystallinity is readily suppressed, the surface smoothness of stacked structures 30B in FIG. 11 can be improved and the crystallinity of stacked structures 30B can also be improved. Moreover, since MOD-YBCO layer 31 having excellent surface smoothness is formed again on the superconducting film having the improved surface smoothness, and gas-phase-formed GdBCO layer 32 is further formed on this MOD-YBCO layer 31, the surface smoothness of oxide superconducting film 30 is improved again. By stacking the plurality of structures each formed of a combination of MOD-YBCO layer 31 and gas-phase-formed GdBCO layer 32 in this manner, oxide superconducting film 30 having a sufficient film thickness can be formed while the surface smoothness is ensured and a decrease in crystallinity is suppressed with ease. As a result, superconducting thin film material 1 having superconducting properties such as desired Ic and Jc can be readily obtained.

A method of manufacturing the superconducting thin film material of the third embodiment will now be described with reference to FIGS. 12 to 15.

Figure 12:
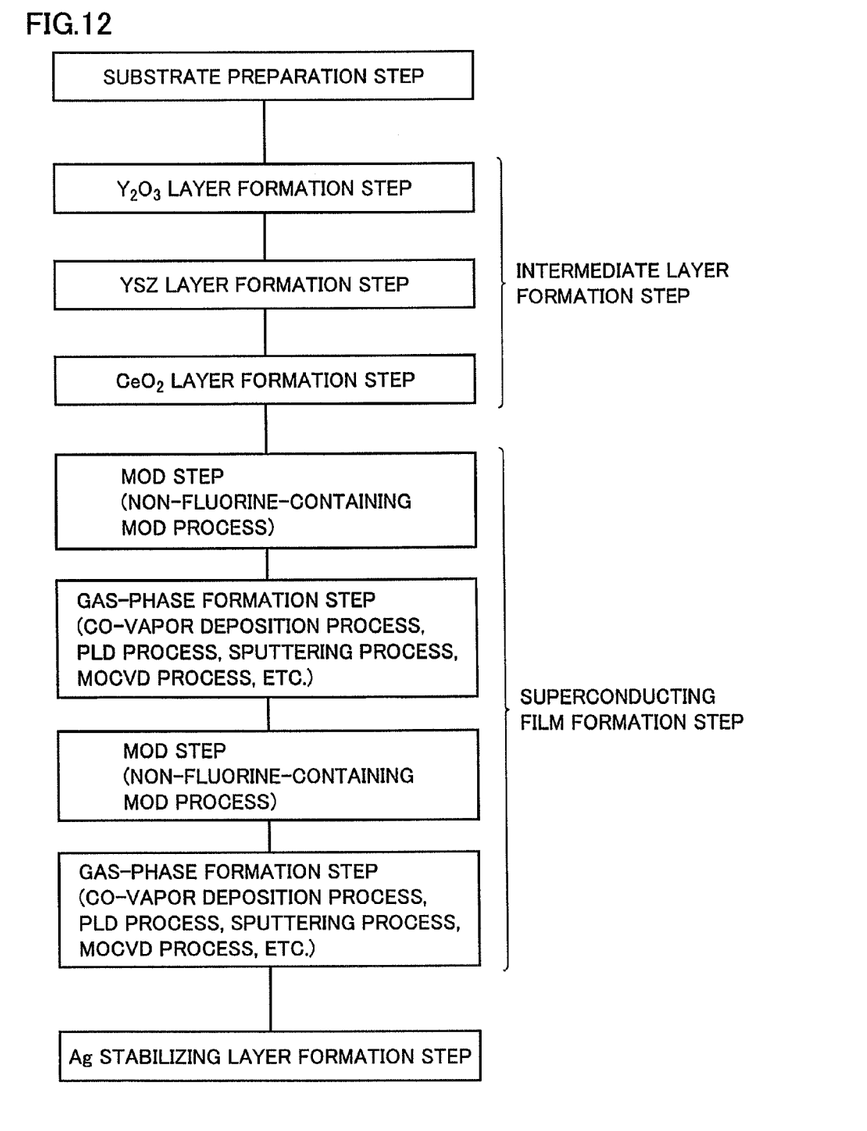
FIG. 12 illustrates the outline of manufacturing steps in a method of manufacturing the superconducting thin film material of the third embodiment.
Figure 13:
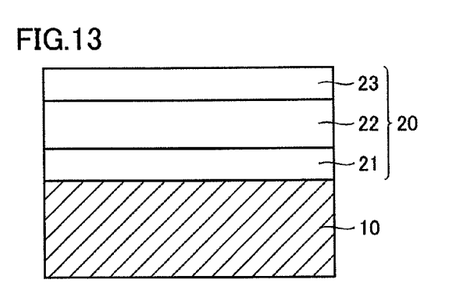
FIG. 13 is a schematic cross-sectional view illustrating the method of manufacturing the superconducting thin film material of the third embodiment.
Figure 14:
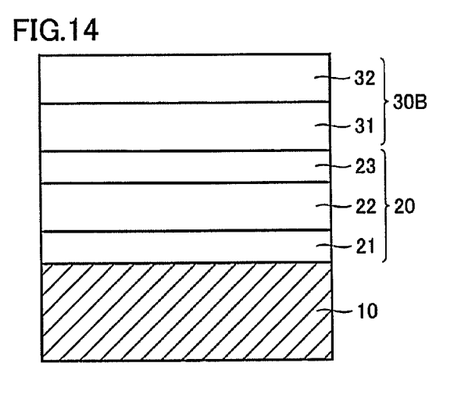
FIG. 14 is a schematic cross-sectional view illustrating the method of manufacturing the superconducting thin film material of the third embodiment.
Figure 15:
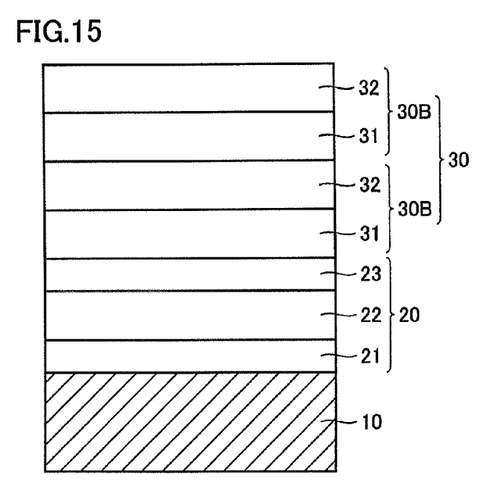
FIG. 15 is a schematic cross-sectional view illustrating the method of manufacturing the superconducting thin film material of the third embodiment.

The method of manufacturing the superconducting thin film material of the third embodiment is basically similar to the method of manufacturing the superconducting thin film material of the first embodiment described with reference to FIGS. 1 to 7. Referring to FIG. 12, however, the third embodiment is different from the first embodiment in that the MOD step and the gas-phase formation step are alternately performed more than once in the superconducting film formation step. Specifically, in the superconducting film formation step, intermediate layer 20 including $Y_2O_3$ layer 21, YSZ layer 22 and $CeO_2$ layer 23 is formed on orientated metal substrate 10 as shown in FIG. 13. Then, stacked structure 30B having gas-phase-formed GdBCO layer 32 formed on MOD-YBCO layer 31 is formed on intermediate layer 20 as shown in FIG. 14. Methods of forming MOD-YBCO layer 31 and gas-phase-formed GdBCO layer 32 are similar to those of the first embodiment. Furthermore, an additional stacked structure 30B is formed on stacked structure 30B as shown in FIG. 15. Stacked structures 30B are formed repeatedly until oxide superconducting film 30 has a desired film thickness. Then, Ag stabilizing layer 40 is formed on oxide superconducting film 30, to complete superconducting thin film material 1 of the third embodiment shown in FIG. 11.

Preferably, in the third embodiment, each MOD-YBCO layer 31 has a thickness of not more than 1 μm. If each MOD-YBCO layer 31 has a thickness of not more than 1 μm, an increase in cost relative to Ic can be suppressed. Preferably, in the third embodiment, each gas-phase-formed GdBCO layer 32 has a thickness of not more than 2 μm, and more preferably not more than 1.5 μM. If each gas-phase-formed GdBCO layer 32 has a thickness of not more than 2 μm, good surface smoothness can be ensured and the crystallinity can be maintained with relative ease.

Although superconducting thin film materials 1 in the first to third embodiments of the present invention described above are wires in the form of a tape, for example, they may be in the form of a sheet, or may have a hollow or solid cylindrical shape.

Figure 16:
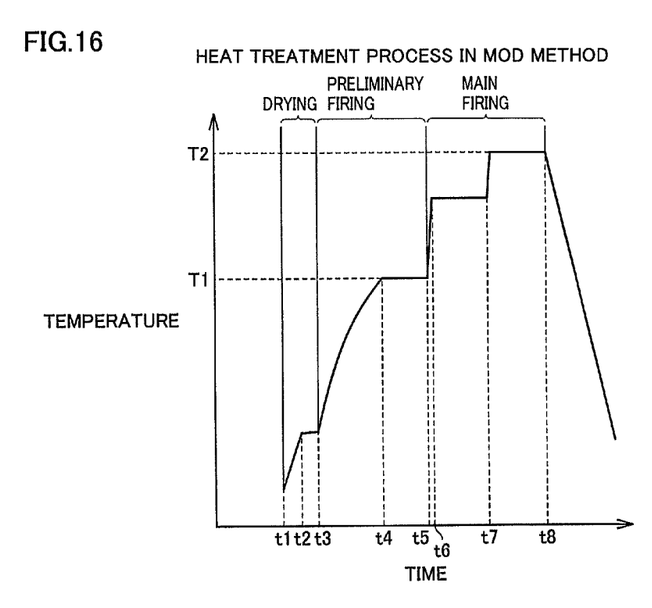
FIG. 16 is a graph illustrating exemplary process conditions in an MOD process.

FIG. 16 illustrates an example of specific process conditions (process temperature pattern) in the MOD layer formation step of forming MOD-YBCO layer 31 in the first to third embodiments described above. The drying step through the main firing step can be performed with the process temperature pattern as shown in FIG. 16. In FIG. 16, the horizontal axis represents time and the vertical axis represents process temperature.

Referring to FIG. 16, the drying step starts at time t1 to heat the substrate between time t1 and time t2. The substrate is thus heated to reach a predetermined drying process temperature at time t2. After time t2 when the substrate reaches the predetermined drying process temperature, the temperature is maintained for a certain period of time (between time t2 and time t3). The drying step is thus performed between time t1 and time t2. The length of time between time t1 and time t3 may be about one hour.

After the completion of this drying step, the preliminary firing step is performed as shown in FIG. 3. Specifically, the heating temperature is raised between time t3 and time t4. After the heating temperature reaches a temperature T1 (500° C.) at time t4, the temperature is maintained for a certain period of time (between time t4 and time t5). The maintenance period may be about 60 minutes, for example. The length of time between time t3 and time t5 (the length of time of the preliminary firing step) may be about three hours, for example.

Then, the main firing step is performed. Specifically, the heating temperature is further raised from time t5 in FIG. 16. When the atmospheric temperature reaches an intermediate heat treatment temperature (about 680° C.) at time t6, the temperature is maintained for a certain period of time (between time t6 and time t7). The maintenance period may be about 90 minutes, for example. The intermediate heat treatment temperature may be in a temperature range from not less than about 620° C. to not more than about 750° C. The atmosphere in this step may have a carbon dioxide concentration of not more than 10 ppm. It is noted that this intermediate heat treatment is intended to decompose carbonate in the material to be processed.

Then, the heating temperature is further raised from time t7. After the atmospheric temperature is raised to a temperature T2 (about 800° C.) which is a main firing temperature, the temperature is maintained in this state for a certain period of time until time t8. The maintenance period may be about 90 minutes, for example. The atmospheric temperature is then lowered. Then, in the oxygen introduction step, oxygen is introduced into the superconducting layer by performing slow cooling over three hours from a maximum heating temperature of 550° C. to 200° C. at 1 atmospheric pressure in an atmosphere of 100% $O_2$ (oxygen). MOD-YBCO layer 31 (see FIG. 1) can be thus formed. The length of time of the main firing step (between time t5 and time t8) may be about three hours, for example.

Figure 17:
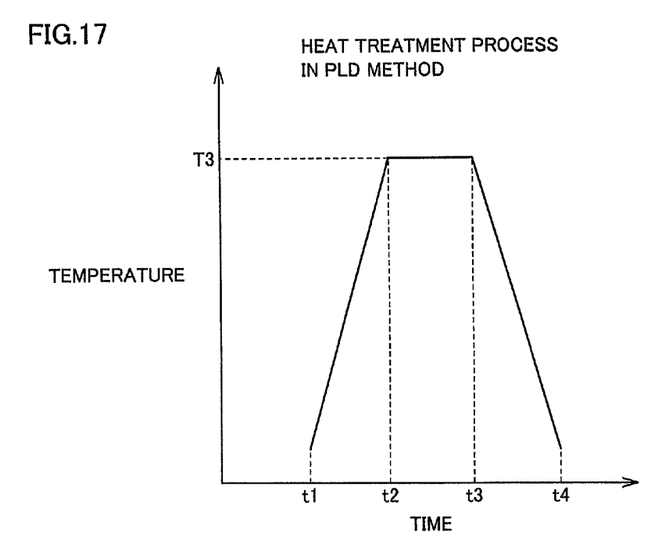
FIG. 17 is a graph illustrating exemplary process conditions in a gas-phase process.

In the gas-phase formation steps in the embodiments 1 to 3 described above, a process temperature pattern such as shown in FIG. 17 can be employed, for example. In FIG. 17, the horizontal axis represents time and the vertical axis represents process temperature.

As shown in FIG. 17, in the gas-phase formation step (see FIG. 4), heating of the substrate starts at time t1, and the heating process continues until time t2 when the temperature of the substrate reaches a temperature T3 (e.g., about 700° C.). Then, with the substrate having temperature T3, the gas-phase-formed GdBCO layer is formed on the previously formed MOD-YBCO layer by a PLD process. During the formation of the gas-phase-formed GdBCO layer by the PLD process (between time t2 and time t3 in FIG. 17), the temperature of the substrate is maintained at temperature T3 (e.g., about 700° C.). The length of time of this film formation by the PLD process (between time t2 and time t3) is about a few minutes, for example. Then, the temperature of the substrate is lowered from time t3 to cool the substrate until time t4 when the temperature reaches a predetermined temperature. Then, in the oxygen introduction step, oxygen is introduced into the superconducting layer by performing slow cooling over three hours from a maximum heating temperature of 550° C. to 200° C. at 1 atmospheric pressure in an atmosphere of 100% $O_2$ (oxygen). Gas-phase-formed GdBCO layer 32 (see FIG. 1) can be thus formed.

Example 1

The following experiments were conducted to confirm the effects of the present invention.

(Samples)

The following samples were prepared to examine the effect of heat treatment in an MOD process on an MOD layer and a gas-phase-formed layer. Specifically, a sample having an intermediate layer formed on a substrate, and a gas-phase-formed GdBCO layer formed on the intermediate layer (Sample No. 1), and a sample having an intermediate layer formed on a substrate, and an MOD-YBCO layer formed on the intermediate layer (Sample No. 2) were prepared.

<Sample No. 1>

As the substrate, an oriented substrate made of a nickel alloy (NiW) was used. As the intermediate layer, a $Y_2O_3$ layer, a YSZ layer and a $CeO_2$ layer were successively formed on the substrate by a sputtering process. The $Y_2O_3$ layer had a thickness of 0.12 μm, the YSZ layer had a thickness of 0.44 μm, and the $CeO_2$ layer had a thickness of 0.06 μm. In addition, a gas-phase-formed GdBCO layer having a thickness of about 1.5 μm was formed on this intermediate layer by a PLD process. The temperature for the film formation was about 700° C.

<Sample No. 2>

A substrate similar to that of Sample No. 1 was prepared, and an intermediate layer was formed on this substrate in a manner similar to that of Sample No. 1. Then, an MOD-YBCO layer having a thickness of about 1.5 μm was formed on the intermediate layer by an MOD process. As an organo-metallic salt solution, a metal acetylacetonate-containing solution (Y:Ba:Cu=1:2:3) described in the first embodiment was used.

The substrate to which this solution had been applied was subjected to the drying step through the main firing step with the process temperature pattern as shown in FIG. 16. Referring to FIG. 16, the length of time of the drying step (between time t1 and time t3 in FIG. 16) was about one hour.

After the completion of the drying step, the preliminary firing step was performed as shown in FIG. 3. Specifically, temperature T1 which is the heating temperature at time t4 in FIG. 16 was set to 500° C., and this temperature was maintained for a certain period of time (about 60 minutes between time t4 and time t5). The length of time between time t3 and time t5 (the length of time of the preliminary firing step) was about 3 hours.

Then, the main firing step was performed. Specifically, the heating temperature was further raised from time t5 in FIG. 16. When the atmospheric temperature reached the intermediate heat treatment temperature (about 680° C.) at time t6, the temperature was maintained for a certain period of time (about 90 minutes between time t6 and time t7). The atmosphere in this step had a carbon dioxide concentration of not more than 10 ppm.

Then, the heating temperature was further raised from time t7. After the atmospheric temperature was raised to temperature T2 (about 800° C.) which is a main firing temperature, the temperature was maintained in this state for a certain period of time (about 90 minutes) until time t8. The atmospheric temperature was then lowered. The MOD-YBCO layer was thus formed.

(Experiment Description)

Samples No. 1 and No. 2 were again subjected to the heat treatment by the MOD process shown in FIG. 16. The states of the surfaces of the samples before and after this heat treatment were observed with a scanning electron microscope.

(Results)

Figure 18:
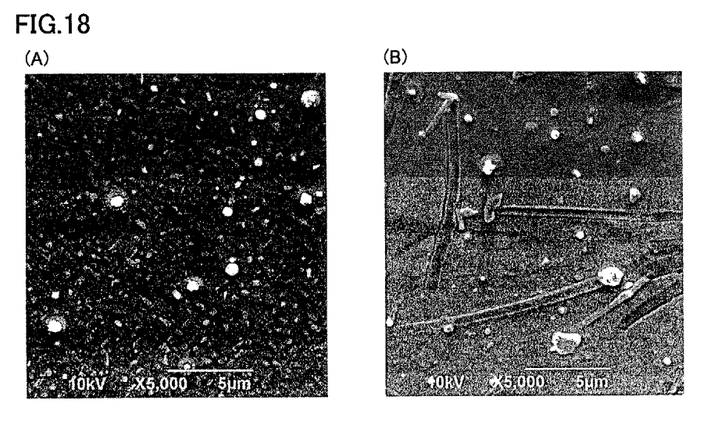
FIG. 18 are pictures showing the result of an experiment where heat treatment was performed on a gas-phase-formed layer under the same conditions as those for heat treatment in an MOD process.
Figure 19:
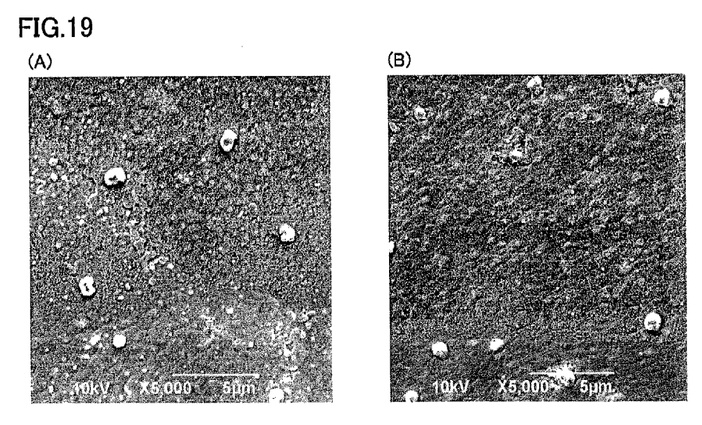
FIG. 19 are pictures showing the result of an experiment where crystallization heat treatment was performed on an MOD layer under the same conditions as those for heat treatment in an MOD process.

The measurement results are shown in FIGS. 18 and 19. FIG. 18(A) shows a surface of the gas-phase-formed GdBCO layer (PLD film) of Sample No. 1, before the above-described heat treatment was performed (a state where no further step has been performed after the gas-phase-formed GdBCO layer was formed). FIG. 18(B) shows the surface of the gas-phase-formed GdBCO layer after the above-described heat treatment was performed. As can be seen from FIG. 18, different phases have been formed on the surface of the gas-phase-formed GdBCO layer as a PLD film as a result of the heat treatment.

FIG. 19(A) shows a surface of the MOD-YBCO layer of Sample No. 2, before the above-described heat treatment was performed (a state where no further step has been performed after the MOD-YBCO layer was formed). FIG. 19(B) shows the surface of the MOD-YBCO layer after the above-described heat treatment was performed. As can be seen from FIG. 19, no particular significant change is observed in the state of the surface of the MOD-YBCO layer as a result of the heat treatment.

It can therefore be seen that the different phases have been formed on the surface of the PLD film due to the heat treatment in the MOD process, resulting in degradation of the state of the surface.

It should be understood that the embodiments and examples disclosed herein are illustrative and non-restrictive in every respect. The scope of the present invention is defined by the terms of the claims, rather than the description above, and is intended to include any modifications within the scope and meaning equivalent to the terms of the claims.

INDUSTRIAL APPLICABILITY

A superconducting thin film material and a method of manufacturing the same of the present invention are applicable particularly advantageously to a superconducting thin film material having a superconducting film formed on a substrate and a method of manufacturing the same.

REFERENCE SIGNS LIST 1 superconducting thin film material; 10 orientated metal substrate; 10A main surface; 20 intermediate layer; 21 $Y_2O_3$ layer; 22 YSZ layer; 23 $CeO_2$ layer; 31 MOD-YBCO layer; 32 gas-phase-formed GdBCO layer; 30 oxide superconducting film; 30A superconducting film surface; 30B stacked structure; 31A MOD-YBCO layer surface; 32A gas-phase-formed GdBCO layer surface; 40 stabilizing layer.

The invention claimed is:

1. A superconducting thin film material comprising:
   a substrate;
   a superconducting film formed on said substrate; and
   an intermediate layer between said substrate and said superconducting film, said superconducting film including an MOD layer formed by an MOD process to contact with a surface of said intermediate layer, and a gas-phase-formed layer formed on said MOD layer by a gas-phase process, and
   at least a surface layer of said intermediate layer which contacts with said MOD layer including any one of $Y_2O_3$, YSZ and $CeO_2$.

2. The superconducting thin film material according to claim 1, further comprising a stabilizing layer formed on said superconducting film to contact with a surface of said gas-phase-formed layer.

3. The superconducting thin film material according to claim 2, wherein
   said stabilizing layer includes at least one of Cu, Cu alloy, Ag and Ag alloy.

4. The superconducting thin film material according to claim 1, wherein
   said superconducting film is formed on two opposite main surfaces of said substrate.

5. The superconducting thin film material according to claim 1, wherein
   a plurality of structures each formed of a combination of said MOD layer and said gas-phase-formed layer are stacked in said superconducting film.

6. The superconducting thin film material according to claim 1, wherein
   said MOD layer has a thickness of not more than 1 μm.

7. The superconducting thin film material according to claim 1, wherein
   said gas-phase-formed layer has a thickness of not more than 2 μm.

8. The superconducting thin film material according claim 1, wherein
   said MOD process is a non-fluorine-containing MOD process in which a fluorine-containing organometallic salt solution is not used.

9. The superconducting thin film material according to claim 1, wherein
   said intermediate layer is formed on said substrate to contact with a surface of said substrate.

10. A method of manufacturing a superconducting thin film material, comprising the steps of:
    preparing a substrate;
    forming an intermediate layer on said substrate; and
    forming a superconducting film on said intermediate layer,
    said step of forming a superconducting film including the steps of
        forming an MOD layer by an MOD process to contact with a surface of said intermediate layer, and
        forming a gas-phase-formed layer on said MOD layer by a gas-phase process, and
    at least a surface layer of said intermediate layer which contacts with said MOD layer includes any one of $Y_2O_3$, YSZ and $CeO_2$.

11. The method of manufacturing a superconducting thin film material according to claim 10, further comprising the step of forming a stabilizing layer on said superconducting film to contact with a surface of said gas-phase-formed layer.

12. The method of manufacturing a superconducting thin film material according to claim 11, wherein
    said stabilizing layer includes at least one of Cu, Cu alloy, Ag and Ag alloy.

13. The method of manufacturing a superconducting thin film material according to claim 10, wherein
    said intermediate layer is formed on said substrate to contact with a surface of said substrate.

* * * * *